(12) United States Patent
Wan et al.

(10) Patent No.: US 11,456,232 B2
(45) Date of Patent: Sep. 27, 2022

(54) THERMAL ASSEMBLIES FOR MULTI-CHIP PACKAGES

(71) Applicant: Intel Corporation, Santa Clara, CA (US)

(72) Inventors: Zhimin Wan, Chandler, AZ (US); Je-Young Chang, Phoenix, AZ (US); Chia-Pin Chiu, Tempe, AZ (US); Shankar Devasenathipathy, Tempe, AZ (US); Betsegaw Kebede Gebrehiwot, Chandler, AZ (US); Chandra Mohan Jha, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 902 days.

(21) Appl. No.: 16/100,406

(22) Filed: Aug. 10, 2018

(65) Prior Publication Data
US 2020/0051894 A1    Feb. 13, 2020

(51) Int. Cl.
*H01L 23/427* (2006.01)
*H01L 25/18* (2006.01)

(52) U.S. Cl.
CPC ............ *H01L 23/427* (2013.01); *H01L 25/18* (2013.01)

(58) Field of Classification Search
CPC . H01L 23/427; H01L 25/0655; H01L 25/071; H01L 25/0753; H01L 25/115
See application file for complete search history.

(56) References Cited

U.S. PATENT DOCUMENTS

| 6,519,154 B1 | 2/2003 | Chiu |
| 9,147,633 B2 | 9/2015 | Eid et al. |
| 2017/0162542 A1* | 6/2017 | Chen ................. H01L 25/50 |
| 2019/0198489 A1* | 6/2019 | Kim .................. H01L 25/18 |

\* cited by examiner

*Primary Examiner* — Tucker J Wright
(74) *Attorney, Agent, or Firm* — Akona IP PC

(57) ABSTRACT

Disclosed herein are thermal assemblies for multi-chip packages (MCPs), as well as related methods and devices. For example, in some embodiments, a thermal assembly for an MCP may include a heat pipe having a ring shape.

22 Claims, 14 Drawing Sheets

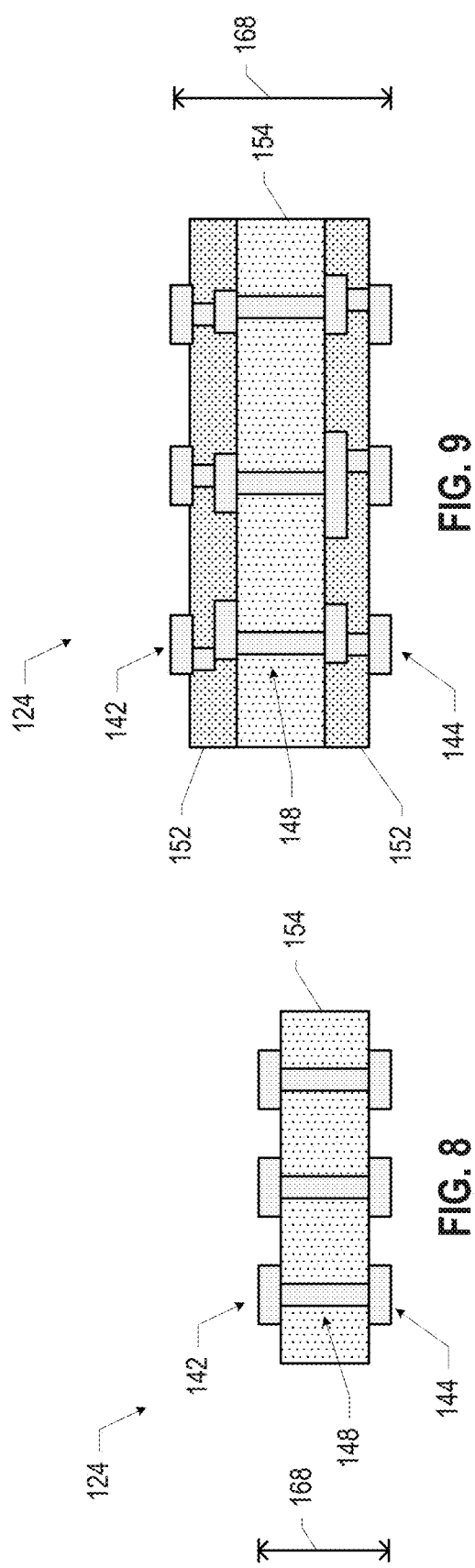

THERMAL ASSEMBLIES FOR MULTI-CHIP PACKAGES

BACKGROUND

To move heat away from sensitive components during the operation of some electronic devices, heat sinks with heat-dissipating fins may be mounted to heat-generating components.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 8-9 are side, cross-sectional views of example interposers that may be used in a thermally managed MCP, in accordance with various embodiments.

DETAILED DESCRIPTION

Disclosed herein are thermal assemblies for multi-chip packages (MCPs), as well as related methods and devices. For example, in some embodiments, a thermal assembly for an MCP may include a heat pipe having a ring shape. Other embodiments are also disclosed.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. For convenience, the phrase "FIG. 1" may be used to refer to the collection of drawings of FIGS. 1A-1B.

Figure 1A:
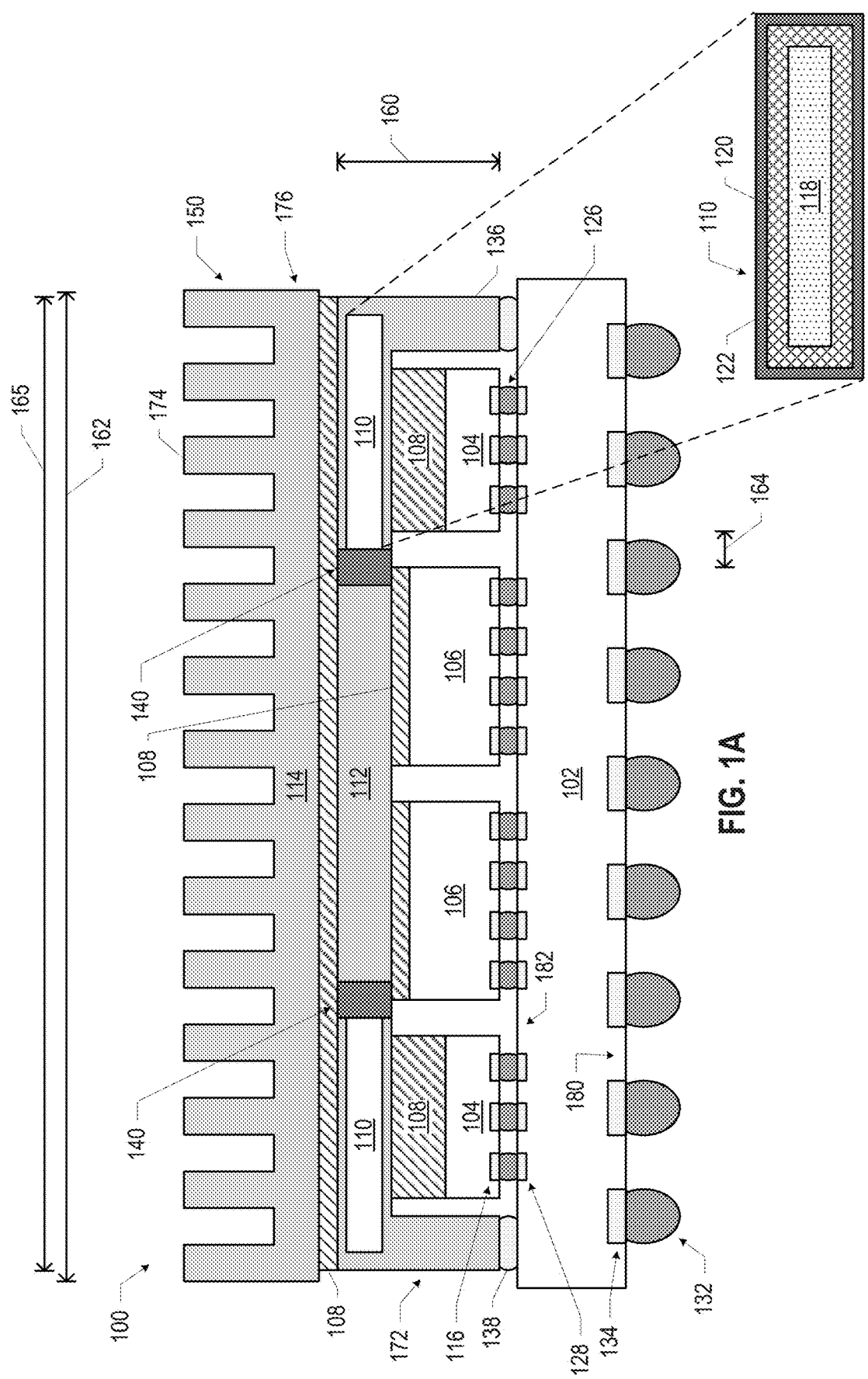
FIGS. 1A and 1B are various views of an example thermally managed multi-chip package (MCP), in accordance with various embodiments.
Figure 1B:
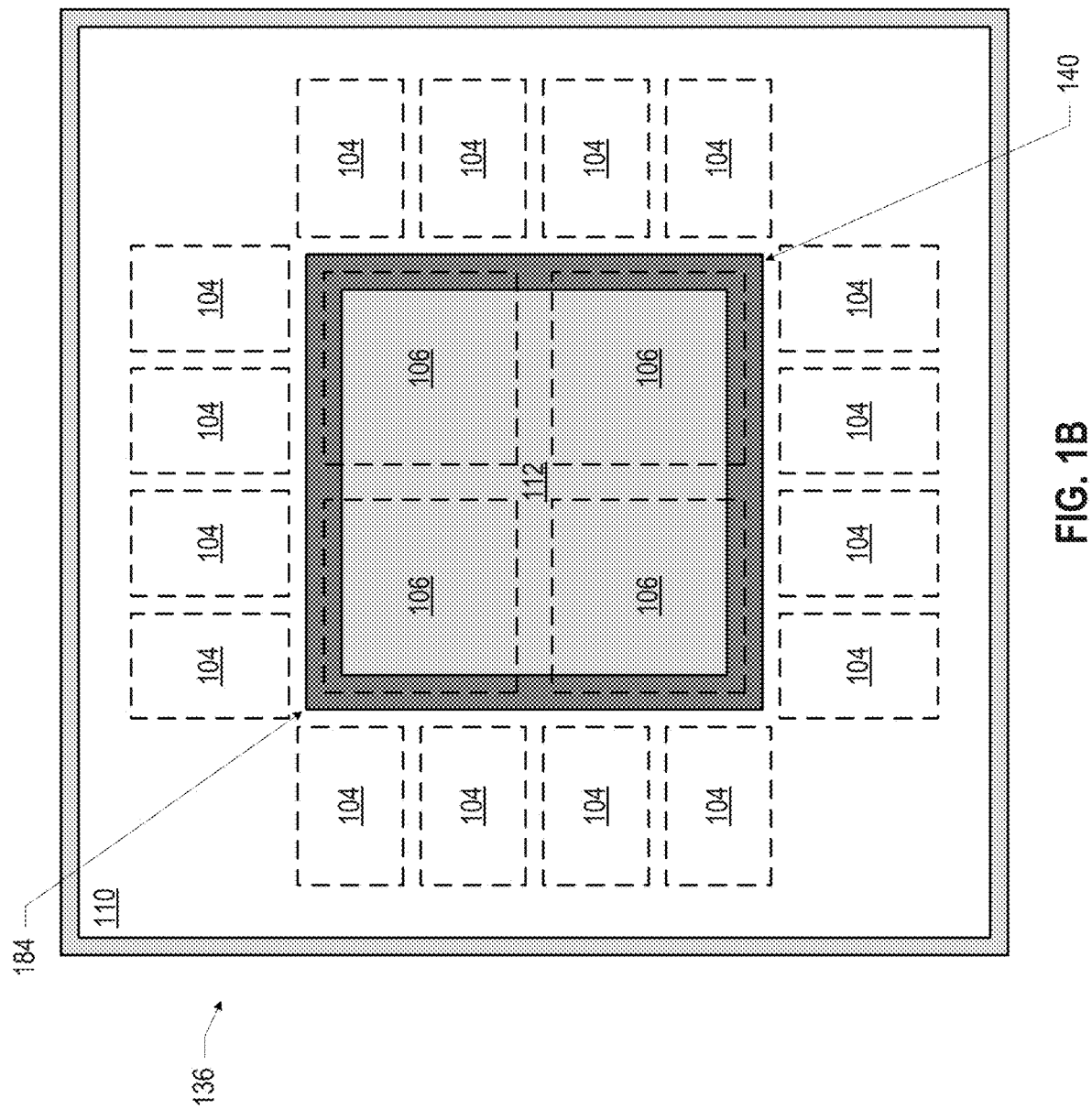

FIG. 1 illustrates an example thermally managed MCP 100, in accordance with various embodiments. In particular, FIG. 1A is a side, cross-sectional view of the thermally managed MCP 100, and FIG. 1B is a top, cross-sectional view. In some embodiments, the thermally managed MCPs 100 disclosed herein may be a system-in-package (SiP). The thermally managed MCP 100 of FIG. 1 may include a package substrate 102 to which one or more inner components 106 and one or more outer components 104 are coupled. Each component 104/106 may include one or more integrated circuit (IC) dies. As used herein, the terms "inner" and "outer" are relative terms, intended to indicate proximity to the center (or edge) of the thermally managed MCP 100. An inner component 106 may be a component that is closer to the lateral center (farther from the lateral edge) of the package substrate 102 than an outer component 104. Although various ones of the accompanying figures depict a single set of inner components 106 and a single set of outer components 104, this is simply for ease of illustration, and a thermally managed MCP 100 may include more than two "tiers" of components at various distances from the center (or edge) of the package substrate 102. In such embodiments, a single component may be both an "inner" component relative to other components that are closer to the edge of the thermally managed MCP 100, and may also be an "outer" component relative to other components that are closer to the center of the thermally managed MCP 100.

The package substrate 102 may be formed of a dielectric material (e.g., a ceramic, a buildup film, an epoxy film having filler particles therein, etc.), and may have conductive pathways (not shown) extending through the dielectric material between the face 180 and the face 182, or between different locations on the face 180, and/or between different locations on the face 182. These conductive pathways may take the form of any of the interconnects 1628 discussed below with reference to FIG. 14, for example. Conductive contacts 128 may be disposed at the face 182 of the package substrate 102, and conductive contacts 134 may be disposed at the face 180. As used herein, a "conductive contact" may refer to a portion of conductive material (e.g., metal) serving as an interface between different elements; conductive contacts may be recessed in, flush with, or extending away from a surface of an element, and may take any suitable form (e.g., a conductive pad or socket).

Conductive contacts 116 of the components 104/106 may be coupled to the conductive contacts 128 at the face 182 of the package substrate. The conductive contacts 128 may be electrically coupled to conductive pathways through the package substrate 102, allowing circuitry within the components 104/106 to electrically couple to various ones of the conductive contacts 134 (or to other devices included in the package substrate 102, not shown). The components 104/106 may be coupled to the conductive contacts 128 by first-level interconnects 126. The first-level interconnects 126 illustrated in FIG. 1 (and others of the accompanying drawings) are solder bumps, but any suitable first-level interconnects 126 may be used. In some embodiments, an underfill material (not shown) may be disposed between the package substrate 102 and the components 104/106 around the first-level interconnects 126. Example underfill materials may include epoxy materials, as suitable.

Second-level interconnects 132 may be coupled to the conductive contacts 134 at the face 180 of the package substrate 102. The second-level interconnects 132 illustrated in FIG. 1 (and others of the accompanying drawings) are solder balls (e.g., for a ball grid array arrangement), but any suitable second-level interconnects 132 may be used (e.g., pins in a pin grid array arrangement or lands in a land grid array arrangement). The second-level interconnects 132 may be used to couple the thermally managed MCP 100 to another element, such as a circuit board (e.g., a motherboard), an interposer, or another IC package, as known in the art and as discussed below with reference to FIG. 15.

The components 104/106 may include circuitry to perform any desired functionality. For example, or more of the inner components 106 may be logic components (e.g., silicon-based components), and one or more of the outer components 104 may be memory components (e.g., high bandwidth memory (HBM)). In some embodiments, one or more of the inner components 106 may include a central processing unit (CPU) or a graphics processing unit (GPU), while one or more of the outer components 104 may be HBM components (including, e.g., a stack of IC dies).

Although the thermally managed MCP 100 illustrated in FIG. 1 is a flip chip package, other package architectures may be used. For example, the thermally managed MCP 100 may be a ball grid array (BGA) package, such as an embedded wafer-level ball grid array (eWLB) package. In another example, the thermally managed MCP 100 may be a wafer-level chip scale package (WLCSP) or a panel fanout (FO) package. Although four inner components 106 and sixteen outer components 104 are illustrated in the thermally managed MCP of FIG. 1, a thermally managed MCP 100 may include any desired number of components 104/106. A thermally managed MCP 100 may include additional passive elements (not shown), such as surface-mount resistors, capacitors, and inductors disposed on the face 180 or the face 182 of the package substrate 102. More generally, a thermally managed MCP 100 may include any other active or passive elements known in the art.

A thermal assembly 150 may be disposed on and around the package substrate 102 and the components 104/106. In FIG. 1, the thermal assembly 150 may include a lid 136 and a heatsink 114. The lid 136 (which may also be referred to as an integrated heat spreader (IHS)) may include legs 172 that are secured to the package substrate 102 by a sealant 138. The heatsink 114 may include a base 176 and fins 174 extending away from the base 176. The lid 136 may be thermally coupled to the fins 174 by a thermal interface material (TIM) 108. The TIM 108 between the lid 136 and the heatsink 114 (and other portions of the TIM 108 discussed herein) may be a polymer TIM or a solder TIM, as suitable. During operation of the components 104/106 of the thermally managed MCP 100, heat generated by the components 104/106 may be transmitted through the lid 136 (as discussed further below), through the TIM 108 between the lid 136 and the heatsink 114, into the heatsink 114, and dissipated into the ambient environment by the fins 174.

The thermal assemblies 150 disclosed herein may be formed as a unitary element or may be formed by assembling multiple distinct elements, and any of the thermal assemblies 150 disclosed as a unitary element may instead be formed from multiple distinct elements coupled together with a TIM 108 (or vice versa). For example, the thermal assembly 150 of FIG. 1 is illustrated as including a lid 136 coupled to a separate heatsink 114 by a TIM 108, but in other embodiments, the lid 136 and the heatsink 114 may be manufactured together as a unitary element. A number of examples of various thermal assemblies 150 are disclosed herein, and any of these thermal assemblies 150 may be formed as a unitary element or as an assembly of multiple distinct elements, as desired.

The lid 136 of FIG. 1 may include a ring-shaped heat pipe 110, a thermally conductive region 112, and a thermally insulative region 140. In some embodiments, the heat pipe 110 of FIG. 1 may be embedded in other thermally conductive material of the lid 136 (e.g., aluminum or copper) or the heat pipe 110 may be otherwise mechanically supported in the lid 136. A detailed cross-sectional view of a portion of the heat pipe 110 of FIG. 1 is depicted in FIG. 1A. The heat pipe 110 may include an outer envelope 122 made up of a material that is a good thermal conductor (e.g., aluminum or copper, depending on the application) and may have a wicking material 120 disposed around the interior walls of the envelope 122. A working fluid 118 may flow through the interior of the heat pipe 110; as a portion of the heat pipe 110 is heated, working fluid 118 proximate to that portion may carry the heat to a cooler portion of the heat pipe 110 to dissipate, and then the "cooled" working fluid 118 may be circulated back through the wicking material 120. As shown in FIG. 1, the ring-shaped heat pipe 110 may extend laterally and may have an opening 184 perpendicular to the lateral plane of the ring-shaped heat pipe 110; as used herein, the opening 184 may refer to the center volume around which the annular heat pipe 110 extends, and thus the ring shape of the ring-shaped heat pipe 110 may be seen by viewing the ring-shaped heat pipe 110 perpendicularly to its lateral plane. The ring-shaped heat pipe 110 may allow the working fluid 118 to flow in the two-dimensional lateral plane, and thus the ring-shaped heat pipe 110 of FIG. 1 may also be referred to as a ring-shaped embedded vapor chamber.

The thermally conductive region 112 may be disposed in the opening of the ring-shaped heat pipe. The thermally conductive region 112 may be provided by a block of material with good thermal conductivity (e.g., aluminum or copper). A ring-shaped thermally insulative region 140 may be disposed around the thermally conductive region 112, and may space the thermally conductive region 112 apart from the ring-shaped heat pipe 110. The thermally insulative region 140 may include a material having a lower thermal conductivity than the thermally conductive region 112. In some embodiments, the thermally insulative region 140 may include an epoxy or other mold compound, while in other embodiments, the thermally insulative region 140 may include air (e.g., as discussed below with reference to FIG. 2).

The ring-shaped heat pipe 110 of FIG. 1 may be dimensioned so as to extend at least partially over the outer components 104, and the thermally conductive region 112 may be dimensioned so as to extend at least partially over the inner components 106. During operation of the thermally managed MCP 100, heat generated by the outer components 104 may be transmitted to the heat pipe 110 via intervening TIM 108 and transferred by the high lateral thermal conductivity of the heat pipe 110 toward the "cooler" edges of the lid 136, where the heat may be rejected. Heat generated by the inner components 106 may be substantially absorbed by the thermally conductive region 112 via the intervening TIM 108. Thermal "cross talk" between the inner components 106 and the outer components 104 may be mitigated by the presence of the thermally insulative region 140 in the lid 136, and thus heat generated by the outer components 104 (inner components 106) may not undesirably heat the inner components 106 (outer components 104). The heat absorbed by the lid 136 may be transmitted to the heatsink 114 by the TIM 108 between the lid 136 and the heatsink 114, as discussed above.

Mitigating thermal crosstalk between the inner components 106 and the outer components 104 may allow the inner components 106 and the outer components 104 to be placed closer together than conventionally achievable, and/or may allow better performance of the inner components 106 or the outer components 104 because the additional heat generated during performance may be adequately managed. For example, the inner components 106 (e.g., CPUs/GPUs) may generate significant amounts of heat during operation, and in conventional packaging arrangements, this heat may be absorbed by the outer components 104 (e.g., HBM) and may push the outer components 104 above their allowable maximum temperature (e.g., above the junction temperature (Tj) for reliable performance). Conventional approaches to managing thermal crosstalk have included complex liquid cooling technologies, reducing the amount of heat generated by decreasing the power (and performance) of the inner components 106, operating the outer components 104 with less power (e.g., by reducing the workload or refresh frequency of HBM included in the outer components 104), and/or using high cost and/or low reliability materials (e.g., some solder TIMs). The thermally managed MCPs 100 disclosed herein may achieve good thermal performance without the drawbacks of these conventional approaches. For example, use of various ones of the techniques disclosed herein may allow the junction temperature of HBM included in the outer components 104 to be maintained under its allowed maximum without throttling performance of the inner components 104.

The dimensions of the thermal assembly 150, or other portions of the thermally managed MCP 100, may take any suitable values. For example, in some embodiments, the distance 164 between adjacent ones of the components 104/106 (e.g., the distance between a CPU/GPU inner component 106 and an HBM outer component 104) may be less than 100 microns. In such embodiments, including a thermally insulative region 140 in the thermal assembly 150 to mitigate thermal cross talk between the inner components 106 and the outer components 104 may be particularly valuable in maintaining thermal performance of the thermally managed MCP 100. The ring-shaped heat pipe 110 may assist in mitigating thermal cross talk by moving heat generated by the outer components 104 toward the edges of the thermally managed MCP 100 (and away from the inner components 106). In some embodiments, the height 160 of the lid 136 of the thermal assembly 150 may be between 2 millimeters and 5 millimeters. In some embodiments, a lateral dimension 162 of the heatsink 114 may be between 40 millimeters and 150 millimeters (e.g., between 70 millimeters and 100 millimeters). A lateral dimension 165 of the lid 136 may be between 40 millimeters and 70 millimeters. For example, the lid 136 may have lateral dimensions that are 50-60 millimeters by 50-60 millimeters. In some variants of any of the embodiments disclosed herein, the lateral dimensions of the heatsink 114 may be larger than the lateral dimensions of the lid 136. The relative thicknesses of different portions of the TIM 108 may depend on the relative heights of the components (e.g., the relative heights of the inner components 106 and the outer components 104).

Figure 2:
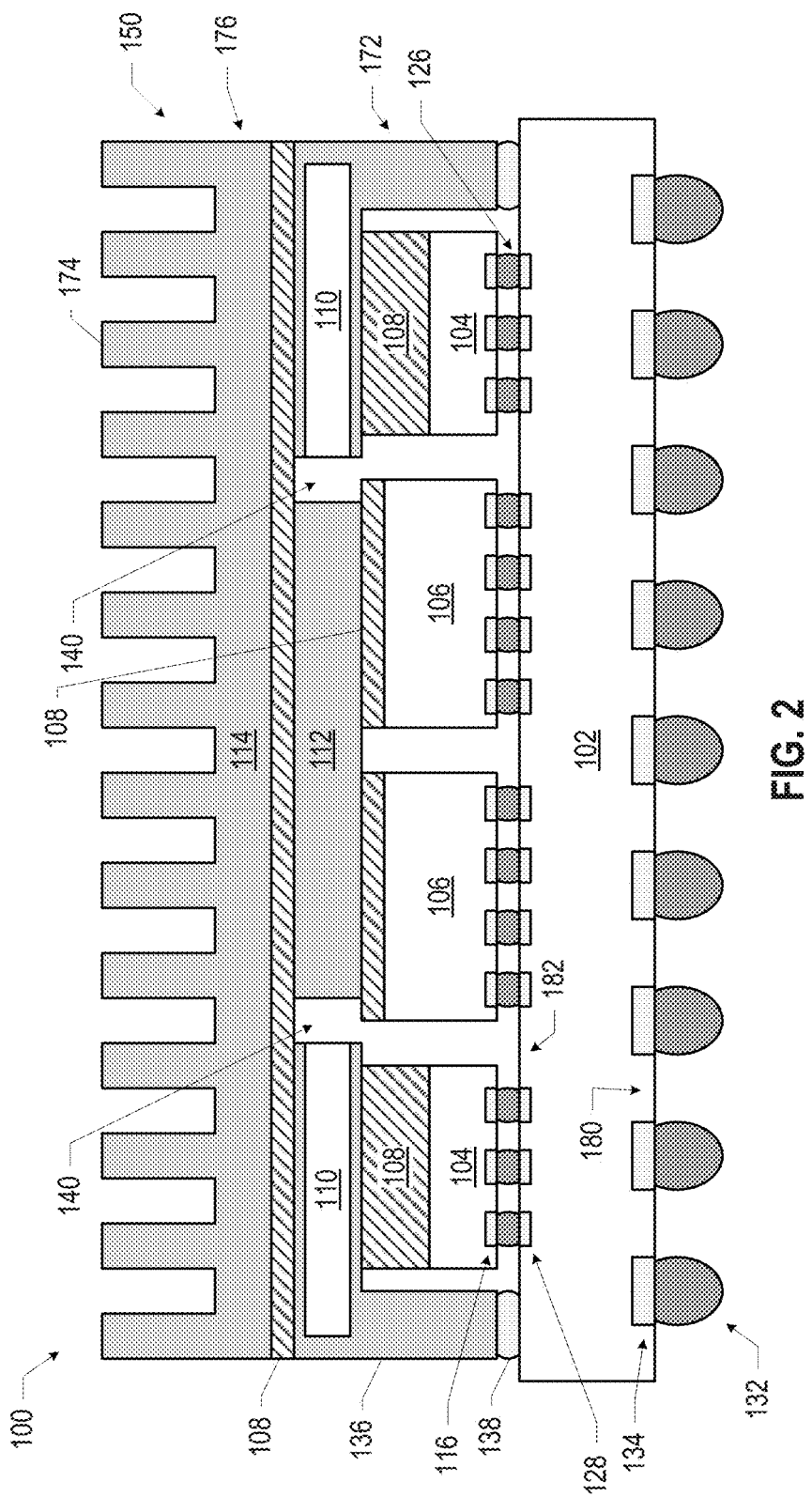
FIGS. 2-7 are side, cross-sectional views of example thermally managed MCPs, in accordance with various embodiments.
Figure 3:
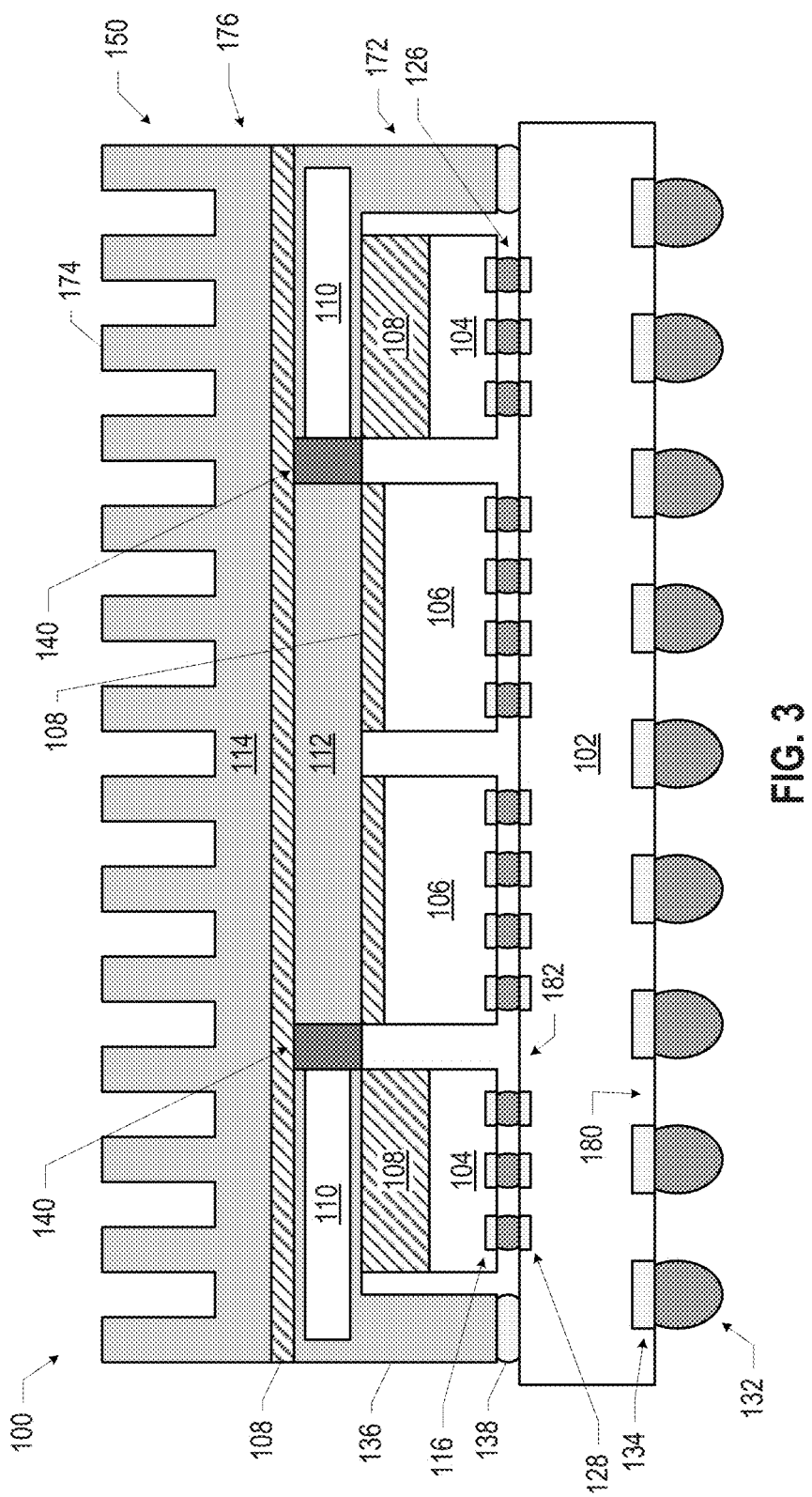
Figure 4:
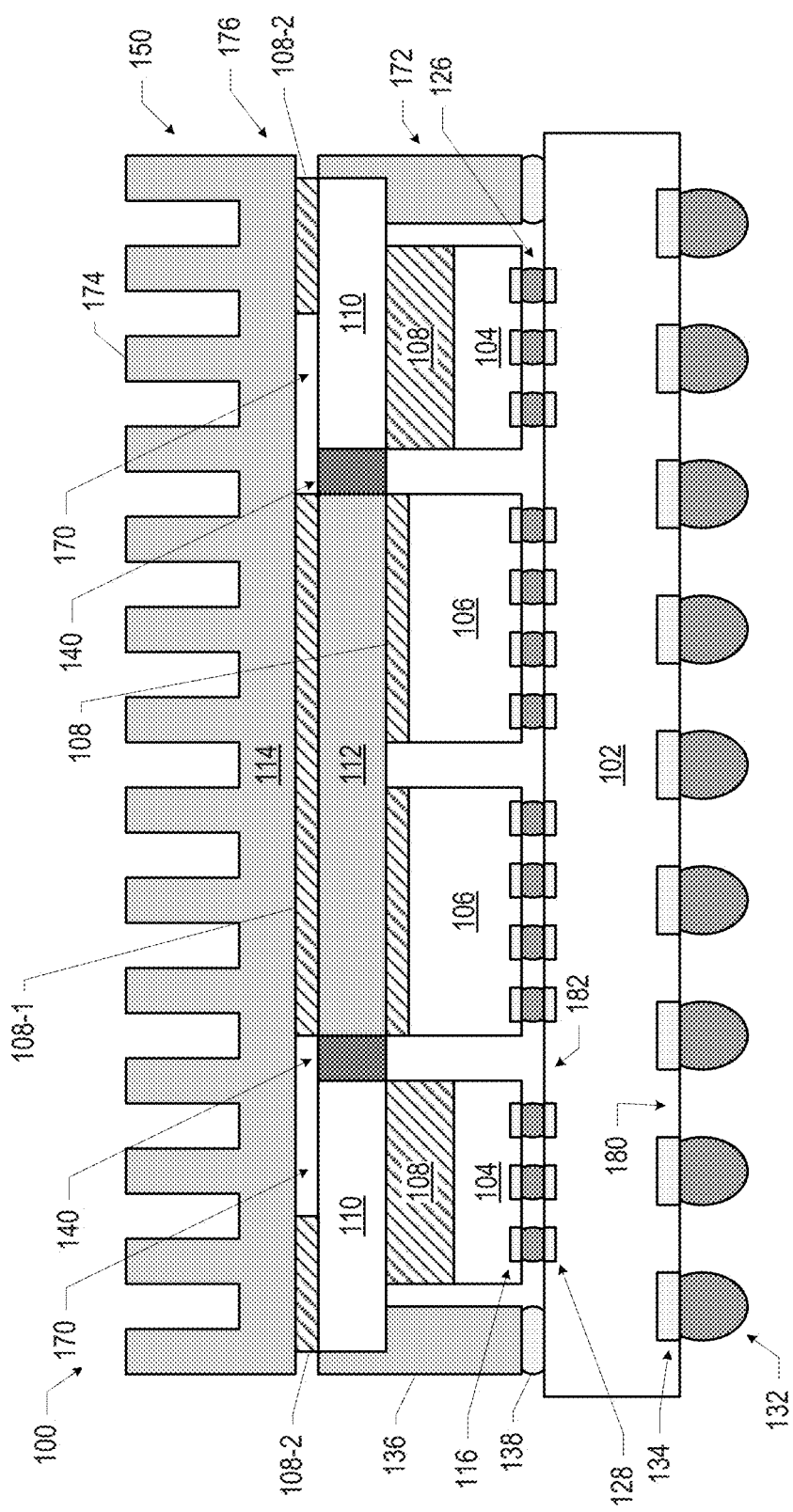

FIGS. 2-12 illustrate additional example thermally managed MCPs 100 with various thermal assemblies 150. Any of the features discussed with reference to any of FIGS. 1-12 herein may be combined with any other features to form a thermally managed MCP 100 or thermal assembly 150. For example, as discussed further below, FIG. 2 illustrates an embodiment in which the thermally insulative region 140 is provided by air, and FIG. 4 illustrates an embodiment in which a thermally insulative region 170 is present between a portion of the heat pipe 110 and the base 176 of the heatsink 114. These features of FIGS. 2 and 4 may be combined so that a thermally managed MCP 100 includes a thermally insulative region 140 provided by air and also include a thermally insulative region 170 between the heat pipe 110 and the base 176 of the heatsink 114. This particular combination is simply an example, and any combination may be used. A number of elements of FIG. 1 are shared with FIGS. 2-12; for ease of discussion, a description of these elements is not repeated, and these elements may take the form of any of the embodiments disclosed herein.

As noted above, in some embodiments, a thermally insulative region 140 between a heat pipe 110 and a thermally conductive region 112 may be provided by air. FIG. 2 illustrates an example of such an embodiment. The heat pipes 110 of FIGS. 2-4 may be ring-shaped, as discussed above with reference to FIG. 1, or maybe separate heat pipes 110 arranged in a ring pattern, as discussed below with reference to FIG. 5.

In the embodiment of FIG. 1, the thermally conductive region 112 of the lid 136 does not extend all the way to the outer edges of the inner components 106, and the heat pipe 110 extends past the inner edges of the outer components 104. This particular arrangement is simply illustrative, and the thermally conductive region 112, the heat pipe 110, and the intervening thermally insulative region 140 may be positioned in other ways relative to the underlying inner components 106 and outer components 104. For example, FIG. 3 illustrates an embodiment in which the thermally insulative region 140 is aligned with the outer edges of the inner components 106 and the inner edges of the outer components 104. The arrangement of FIG. 3 is also illustrative, and in various embodiments, the thermally insulative region 140 may extend over the inner components 106 and/or over the outer components 104.

In some embodiments, a thermally insulative region may be present between a portion of the heat pipe 110 and the base 176 of the heatsink 114. For example, FIG. 4 illustrates a thermally managed MCP 100 having a ring-shaped thermally insulative region 170 disposed between the top surface of the heat pipe 110 and the base 176 of the heatsink 114. This thermally insulative region 170 may be disposed over an interior portion of the top surface of the heat pipe 110 (closer to the opening 184), and may reduce heat transfer between the portion of the heat pipe 110 under the thermally instead of region 170 and the heatsink 114, forcing more heat transfer to occur through an exterior portion of the top surface of the heat pipe 110 (i.e., through the TIM 108 on the exterior portion of the top surface of the heat pipe 110), closer to the outer edges of the thermally managed MCP 100 and thereby further reducing thermal cross talk between the inner components 106 and outer components 104. The thermally insulative region 170 may be provided by a solid material (e.g., an epoxy) or air, for example.

Figure 5:
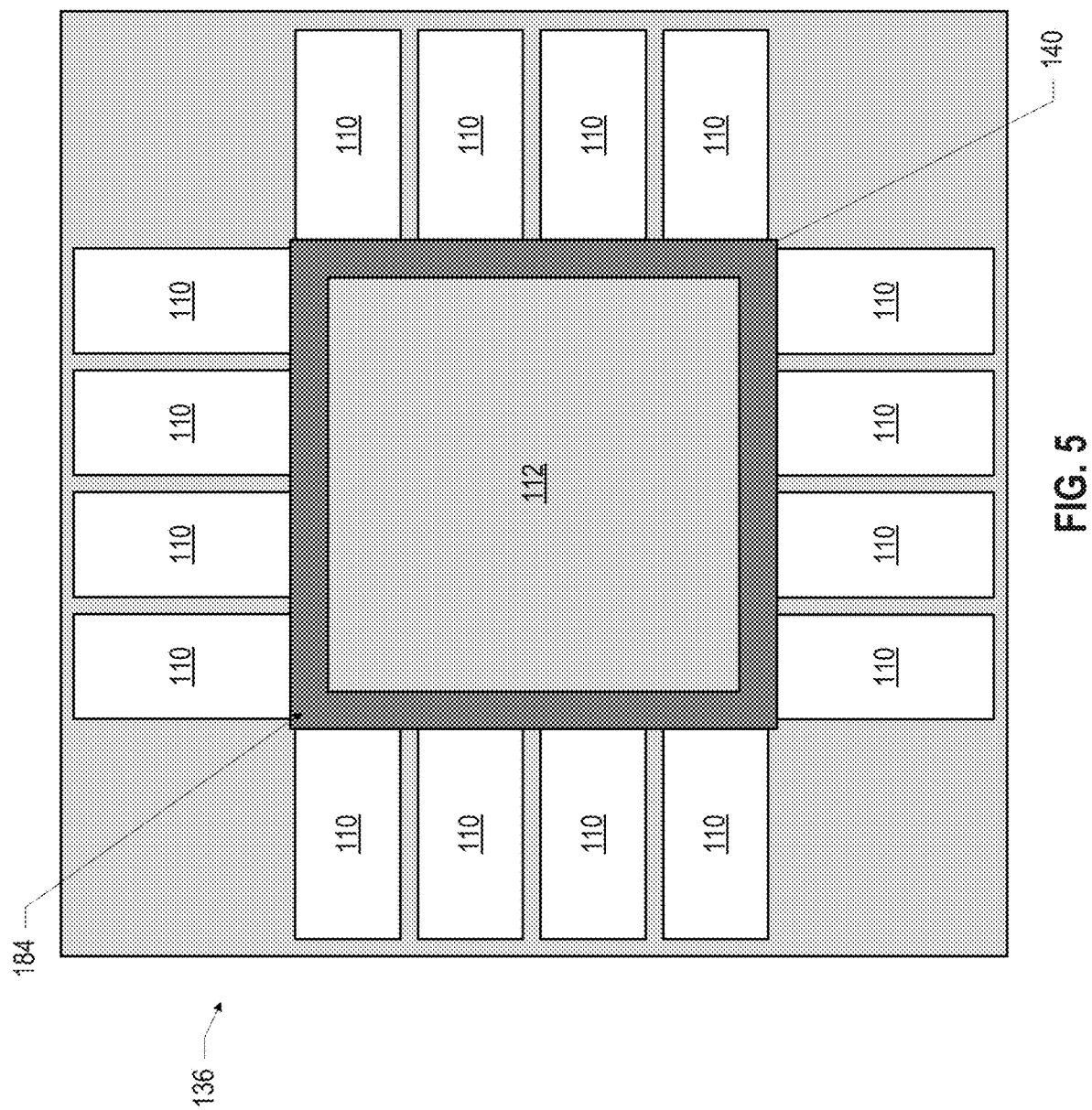

In some embodiments, a thermal assembly 150 of a thermally managed MCP 100 may include multiple distinct heat pipes 110 arranged in a ring pattern, instead of a unitary ring-shaped heat pipe 110 as discussed above with reference to FIG. 1. For example, FIG. 5 illustrates an example top, cross-sectional view of such an embodiment (e.g., through the same section as FIG. 1B). In the embodiment of FIG. 5, multiple different individual heat pipes 110 (which may have cross-sections similar to that illustrated in FIG. 1A) in a lid 136 may be arranged around a thermally conductive region 112. In some embodiments, each one of the outer components 104 may be associated with a different one of the heat pipes 110 (i.e., each different outer component 104 may have a different heat pipe 110 disposed above it and in thermal communication with it via an intervening TIM 108). In other embodiments, a single heat pipe 110 in an embodiment like that illustrated in FIG. 5 may be disposed over multiple outer components 104. Different ones of the heat pipes 110 in an embodiment like that of FIG. 5 may be mechanically coupled together by an epoxy, solder, or other material, or may be embedded in a thermally conductive material (e.g., aluminum or copper) with the interface between the heat pipe 110 and the thermally conductive material provided by an epoxy or solder.

Figure 6:
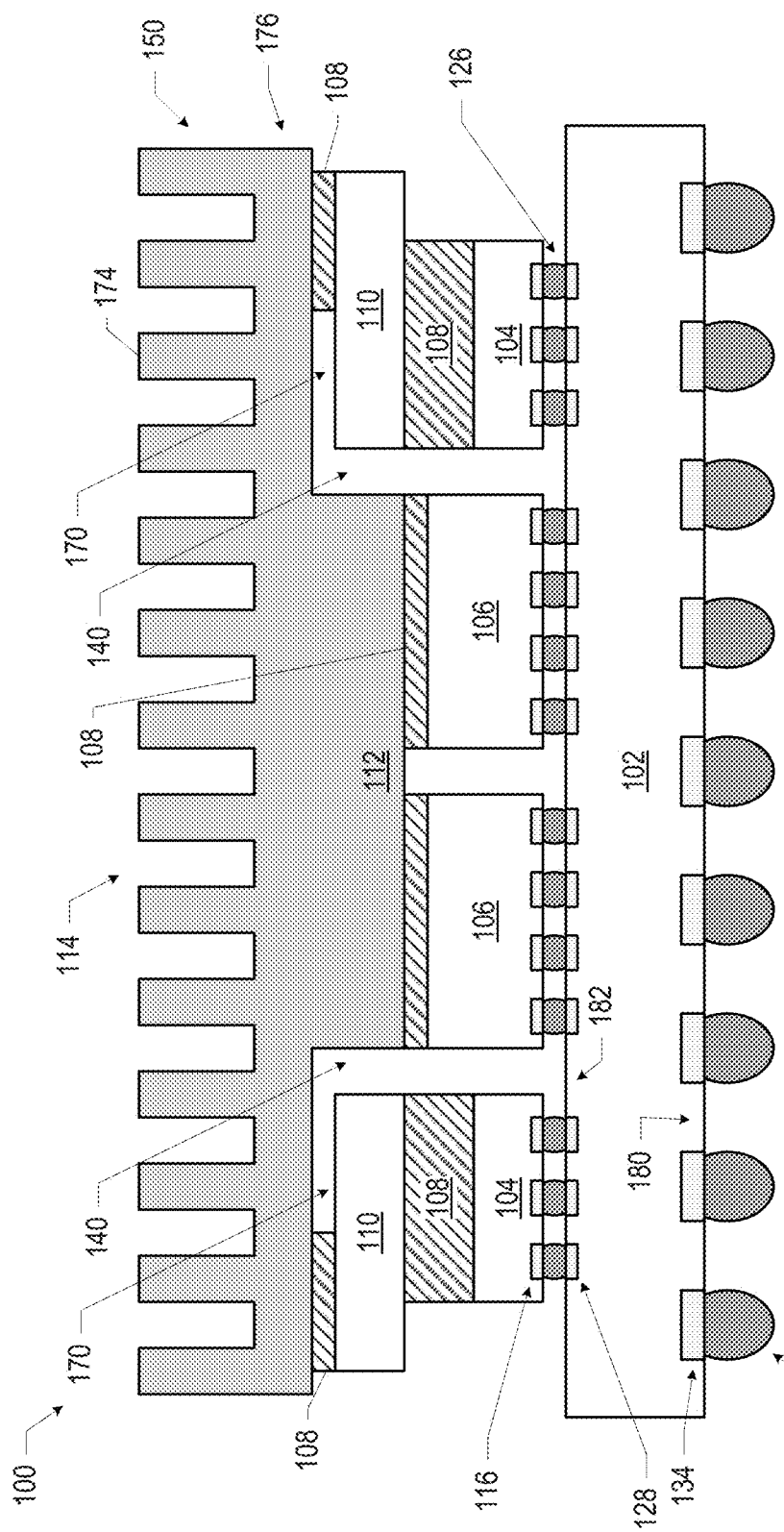

As noted above, elements of a thermal assembly 150 may be provided by a unitary assembly or multiple units thermally coupled by intervening TIM 108. Further, various ones of the elements of the thermal assemblies 150 disclosed herein may be "grouped" into different units. For example, FIG. 6 illustrates an embodiment in which the thermally conductive region 112 of the thermal assembly 150 is provided by a pedestal extending from the base 176 of the heatsink 114. The heat pipe 110 illustrated in FIG. 6 may be provided by a single ring-shaped heat pipe 110 (e.g., as discussed above with reference to FIG. 1), or by multiple heat pipes 110 arranged in a ring-shaped pattern (e.g., as discussed above with reference to FIG. 5). The embodiment of FIG. 6 also includes thermally insulative regions 140 and 170 provided by air; in other embodiments, the thermally insulative region 140 and/or the thermally insulative region 170 may be provided by another material, and/or the thermally insulative region 170 may not be present (i.e., the entire top surface of the heat pipe(s) 110 may be in thermal contact with the heatsink 114 via an intervening TIM 108).

In some embodiments, a thermally managed MCP 100 may include an interposer between one or more of the outer components 104 and the package substrate 102. Such interposers may help remove heat from the outer components 104 by drawing it away toward the package substrate 102, and may be particularly valuable when the outer components 104 have "hotspots" closer to the bottom faces of the components 104. For example, some HBM components may generate approximately 50 percent of their power in a small region of the bottommost logic die of a die stack. This logic die may have a thickness that is between 40 microns and 60 microns, and may have a high spreading resistance. Further, the die stack of an HBM component may have a high thermal resistance due to the dielectric material between dies in the stack, and thus may not be readily amenable to having heat drawn away from the bottom die through the top face of the HBM component. Consequently, HBMs in conventional packages may act as thermal limiters, and may present long term reliability issues due to operation at high temperatures, and/or may require significant performance limitations or management that preclude being able to operate the HBM component at its peak performance. The use of interposers to draw heat from the bottom face of an HBM or other outer component 104, as discussed in detail below, may allow these components to operate with better performance and reliability than conventionally achievable.

Figure 7:
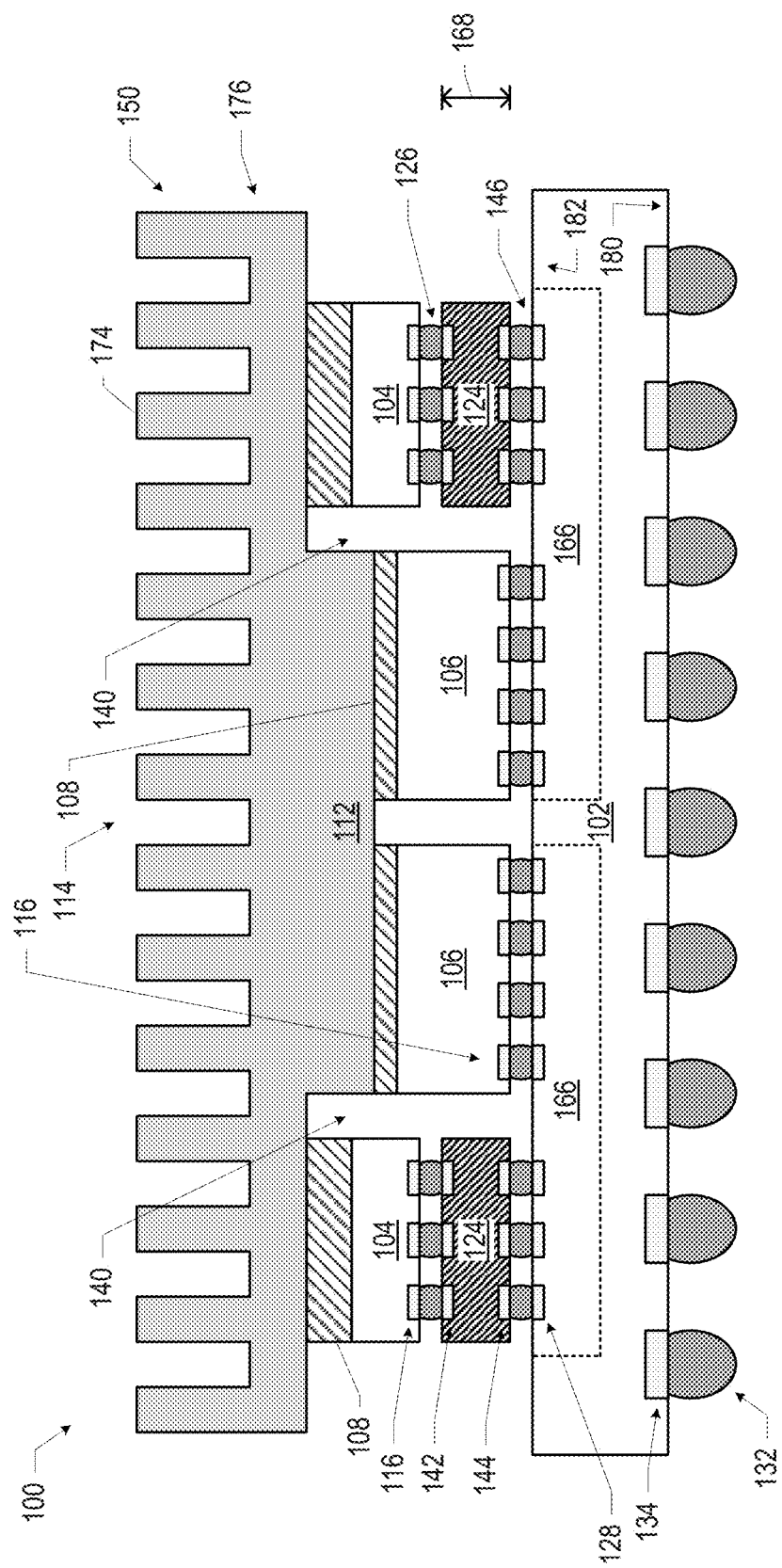

FIG. 7 depicts an example thermally managed MCP 100 including interposers 124 between the outer components 104 and the package substrate 102. In particular, the interposers 124 may include conductive contacts 142 that are coupled to conductive contacts 116 of the outer components 104 by first-level interconnects 126, and may include conductive contacts 144 that are coupled to conductive contacts 128 of the package substrate 102 by first-level interconnects 146.

FIGS. 8 and 9 are side, cross-sectional views of various examples of interposers 124 that may be included in a thermally managed MCP 100. FIG. 8 illustrates an interposer 124 that includes through silicon vias (TSVs) 148 that extend through a silicon substrate 154 and directly couple the conductive contacts 142 with the conductive contacts 144. An interposer 124 like that of FIG. 8 may be particularly suitable when the total thickness 168 of the interposer 124 is less than 100 microns. FIG. 9 illustrates a structure for an interposer 124 that may be suitable when the thickness 168 of the interposer 124 will be greater than 100 microns (e.g., between 100 microns and 1000 microns, or between 100 microns and 600 microns). The interposer 124 of FIG. 9 includes a silicon substrate 154 having TSVs 148 extending therethrough, and also includes redistribution layers (RDLs) 152 on either face of the silicon substrate to couple the TSVs 148 to the conductive contacts 142 and 144. The RDLs 152 may include conductive vias and/or lines (e.g., as discussed below with reference to FIG. 14) to adjust the pitch of the conductive contacts 142 and 144 relative to the pitch of the TSVs 148. Interposers 124 with other structures may also be used. Although various ones of the accompanying drawings illustrate the conductive contacts 142 (conductive contacts 144) as having substantially uniform pitch, this is simply for ease of illustration, and the conductive contacts 142 (conductive contacts 144) may have different pitches in different regions. For example, the pitch of conductive contacts 142 (conductive contacts 144) providing power and ground lines may be greater than the pitch of conductive contacts 142 (conductive contacts 144) providing input/output signals.

Returning to FIG. 7, in some embodiments, each one of the outer components 104 may be associated with a different underlying interposer 124 (i.e., each different outer component 104 may have a different interposer 124 to couple the component 104 to the underlying package substrate 102). In other embodiments, a single interposer 124 may couple multiple outer components 104 to the package substrate 102. In some embodiments, the interposers 124 may be silicon interposers.

In some embodiments, the package substrate 102 may include embedded bridges 166 to couple the interposers 124 (and therefore the outer components 104) to the inner components 106 through the package substrate 102 (as indicated by the dotted lines in FIG. 7). Such embedded bridges 166 may have a higher routing density than achievable by the dielectric material in which they are embedded. In some embodiments, the embedded bridges 166 may be silicon bridges.

Figure 10:
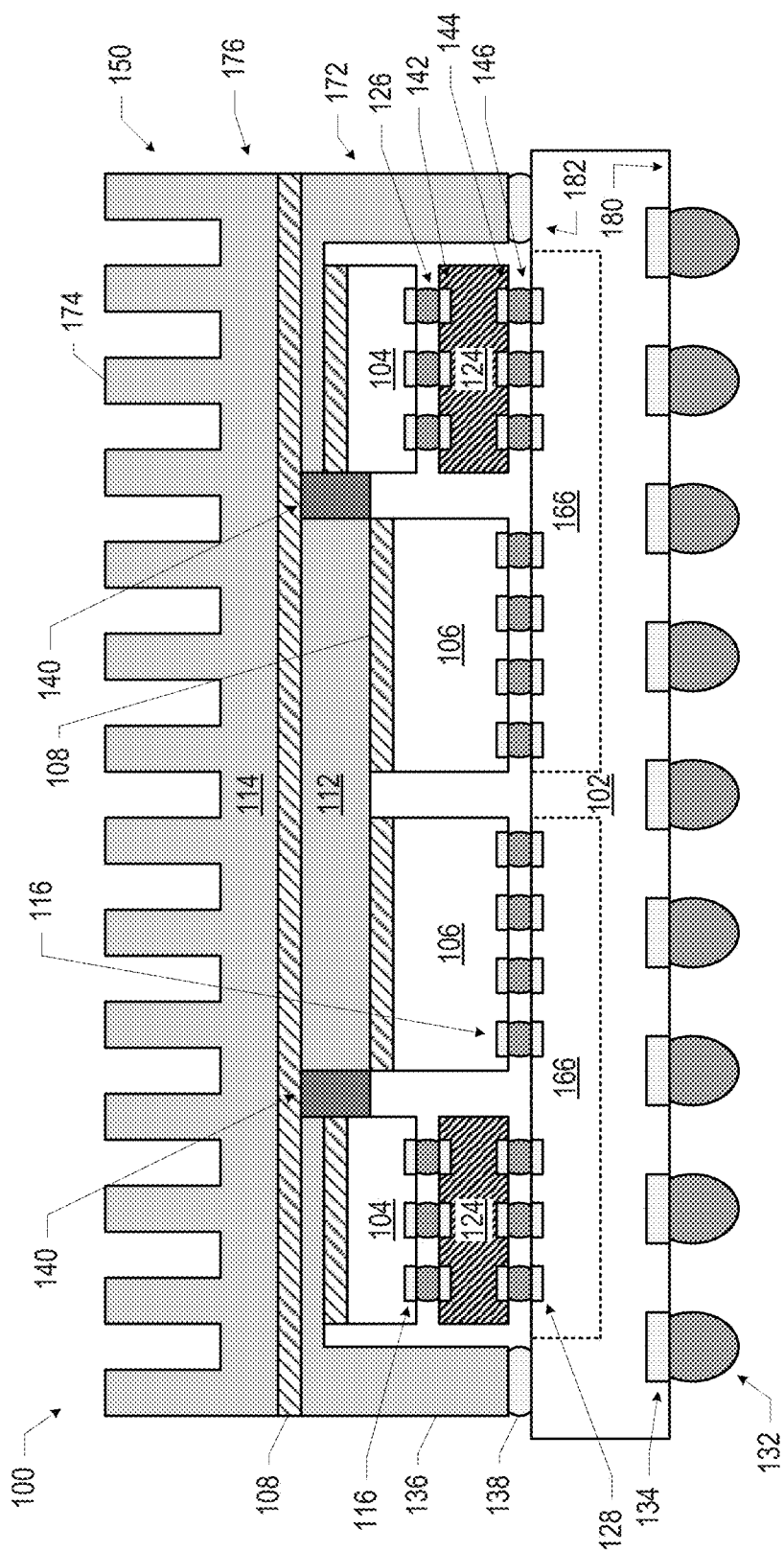
FIGS. 10-12 are side, cross-sectional views of example thermally managed MCPs, in accordance with various embodiments.

FIG. 7 also illustrates a heatsink 114 having substantially the same form illustrated in FIG. 6; in other embodiments, the thermally managed MCP 100 of FIG. 7 may include other ones of the heatsinks 114 disclosed herein. No heat pipes 110 are illustrated in FIG. 7, but heat pipe(s) 110 in accordance with any of the embodiments disclosed herein may be included in the thermally managed MCP 100 of FIG. 7. For example, thermally managed MCPs 100 in accordance with the present disclosure may include interposers 124 between the outer components 104 and the package substrate 102 and may also include one or more heat pipes 110. Further, although no lids 136 are illustrated in FIG. 7, lids 136 in accordance with any of the embodiments disclosed herein may be included in the thermally managed MCP 100 of FIG. 7. For example, FIG. 10 illustrates a thermally managed MCP 100 including interposers 124 as discussed above with reference to FIG. 7, as well as a thermal assembly 150 including lid 136 having thermally insulative regions 140 and a thermally conductive region 112 in accordance with any of the embodiments disclosed herein, and also a heatsink 114.

In some embodiments, a thermally managed MCP 100 may include one or more heat channels that extend through the package substrate 102 and out above the face 182 to couple with a portion of the thermal assembly 150 (e.g., a lid 136). The heat channels may act as a "thermal bypass," removing heat from the package substrate 102 (e.g., heat generated by the outer components 104 close to the face 182) and transferring it to the thermal assembly 150, where may be dissipated. The use of heat channels may provide many of the same advantages as the interposers 124 discussed above; by removing heat from regions close to the "bottom" of the outer components 104, better overall thermal management may be achieved.

Figure 11:
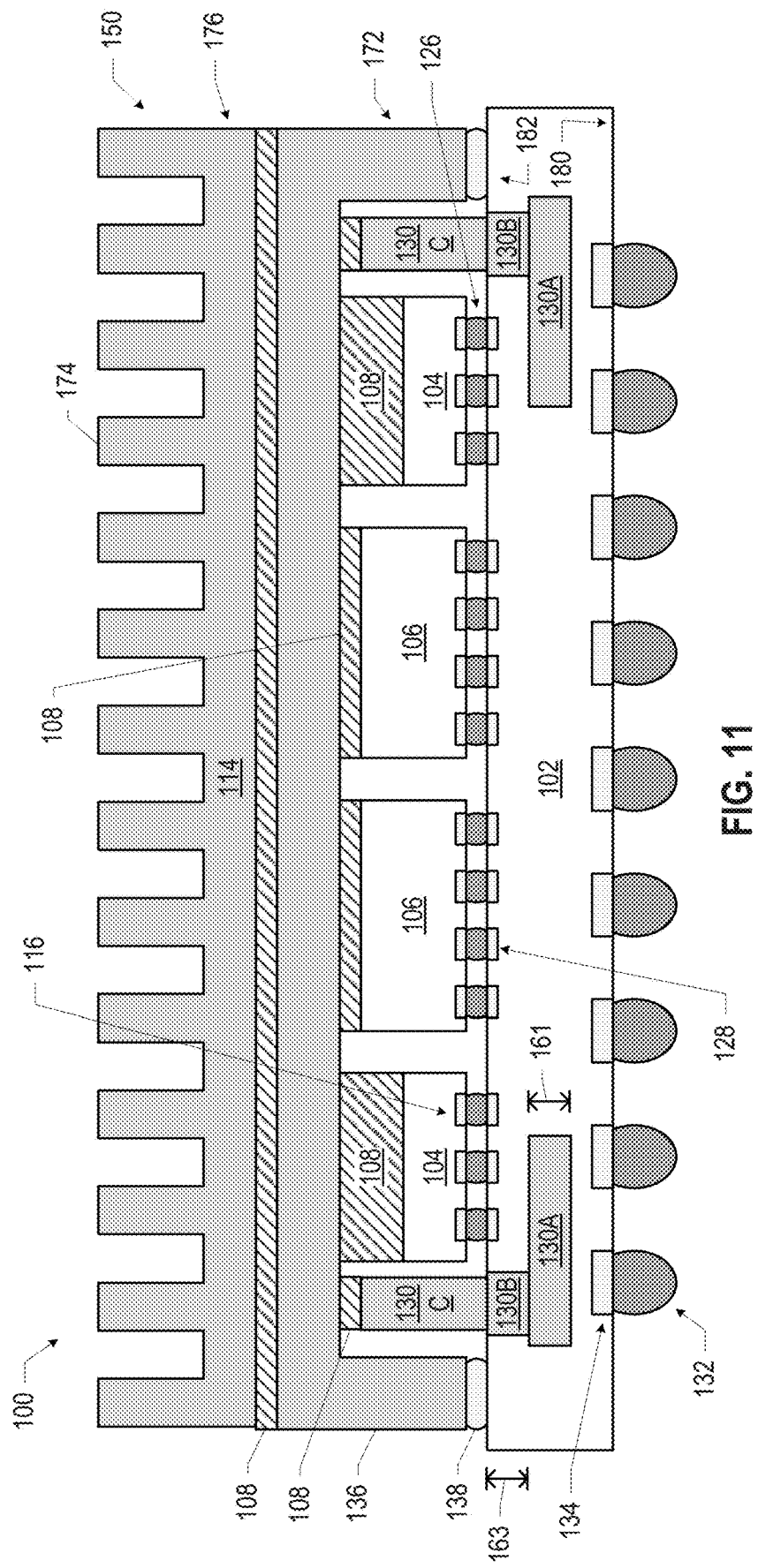

For example, FIG. 11 illustrates a thermally managed MCP 100 including heat channels 130 that extend into the package substrate 102 at least partially under the outer components 104. In particular, the heat channel 130 may include a horizontal portion 130A that is parallel to and spaced away from the face 182, a vertical portion 130B that extends between the horizontal portion 130A and the face 182, and a vertical portion 130C that extends from the vertical portion 130B to thermally coupled with a lid 136 via an intervening portion of TIM 108. The vertical portions 130B and 130C may provide a direct path with low thermal resistance to the thermal assembly 150 (e.g., so that heat from the bottom logic die of an HBM outer component 104 may be transferred to the thermal assembly 150 without going through the high resistance HBM die stack).

The heat channel 130 may be formed of any suitably thermally conductive material or materials, such as copper. Different portions of the heat channel 130 may be formed of different materials. In some embodiments, the horizontal portion 130A may be a copper block, and the vertical portion 130C may be a copper pillar. In some embodiments, the vertical portion 130B may include one or more copper vias. The horizontal portion 130A may extend partially or entirely under an outer component 104. In some embodiments, each one of the outer components 104 may be associated with a different heat channel 130 (i.e., each different outer component 104 may have a different heat channel 130 to remove heat from the portion of the package substrate 102 under that outer component 104), while in other embodiments, a single heat channel 130 may be disposed partially under multiple outer components 104. In some embodiments, the heat channel 130 may not be in conductive contact with any of the outer components 104.

The heat channels 130 disclosed herein may have any suitable dimensions. For example, in some embodiments, a thickness 161 of the horizontal portion 130A may be between 200 microns and 500 microns. In some embodiments, a height 163 of the vertical portion 130B may be between 50 microns and 200 microns.

Figure 12:
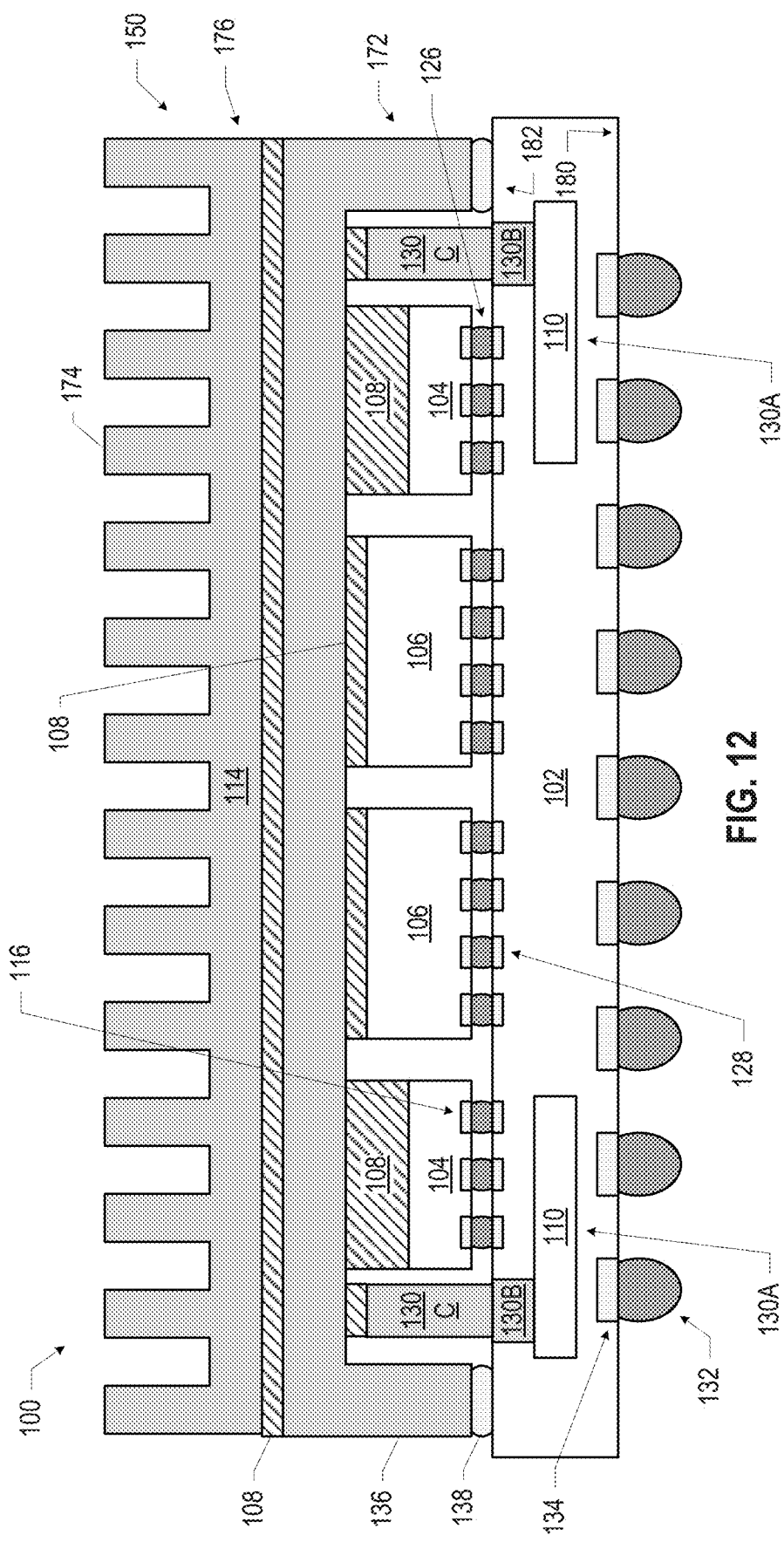

In some embodiments, a heat pipe may be used to provide the horizontal portion 130A of the heat channel 130. For example, FIG. 12 illustrates an embodiment of a thermally managed MCP 100 that is substantially similar to the thermally managed MCP 100 of FIG. 11, but in which heat pipe(s) 110 provide the horizontal portions 130A of the heat channels 130. The heat pipe(s) 110 illustrated in FIG. 12 may be provided by a single ring-shaped heat pipe 110 (e.g., as discussed above with reference to FIG. 1), or by multiple heat pipes 110 arranged in a ring-shaped pattern (e.g., as discussed above with reference to FIG. 5). Although a particular structure for the lid 136 and the heatsink 114 are illustrated in FIGS. 11 and 12, the thermally managed MCPs 100 of FIGS. 11 and 12 may include any of the thermal assemblies 150 disclosed herein (e.g., lids 136 including heat pipe(s) 110, etc.). Further, thermally managed MCPs 100 that include heat channels 130 may also include interposers 124 between the outer components 104 and the package substrate 102 (e.g., as discussed above with reference to FIGS. 7-10).

The thermally managed MCPs 100 disclosed herein may include, or may be included in, any suitable electronic element. FIGS. 13-16 illustrate various examples of apparatuses that may include, or be included in, any of the thermally disclosed herein, as suitable.

Figure 13:
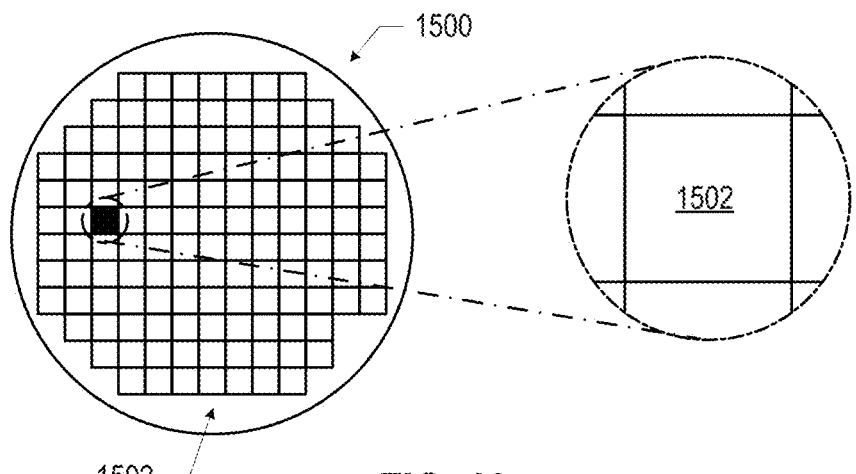
FIG. 13 is a top view of a wafer and dies that may be included in a thermally managed MCP, in accordance with any of the embodiments disclosed herein.

FIG. 13 is a top view of a wafer 1500 and dies 1502 that may be included in a thermally managed MCP 100 in accordance with any of the embodiments disclosed herein. For example, a die 1502 may be, or be part of, the inner component 106 or the outer component 104 of a thermally managed MCP 100. The wafer 1500 may be composed of semiconductor material and may include one or more die 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 14, discussed below) and/or supporting circuitry to route electrical signals to the transistors, as well as any other IC elements. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 16) or other logic that is configured to store information in the memory devices or execute instructions stored in the memory array.

Figure 14:
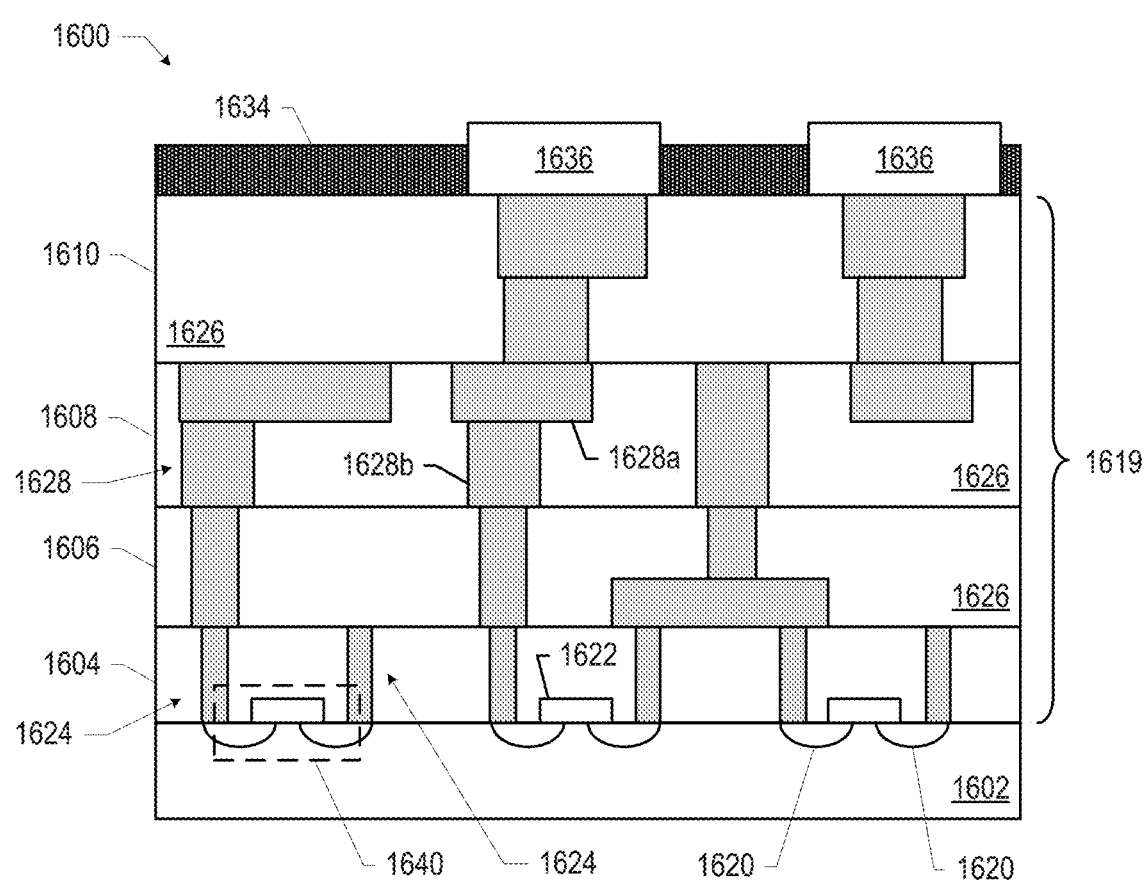
FIG. 14 is a side, cross-sectional view of an integrated circuit (IC) device that may be included in a thermally managed MCP, in accordance with any of the embodiments disclosed herein.

FIG. 14 is a side, cross-sectional view of an IC device 1600 that may be included in a thermally managed MCP in accordance with any of the embodiments disclosed herein. For example, one or more of the IC devices 1600 may be included in one or more die 1502 (FIG. 13). The IC device 1600 may be formed on a substrate 1602 (e.g., the wafer 1500 of FIG. 13) and may be included in a die (e.g., the die 1502 of FIG. 13). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the die 1502 of FIG. 13) or a wafer (e.g., the wafer 1500 of FIG. 13).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 14 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 14 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 14). Although a particular number of interconnect layers 1606-1610 is depicted in FIG. 14, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 14. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 14. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 14, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another element (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external elements.

Figure 15:
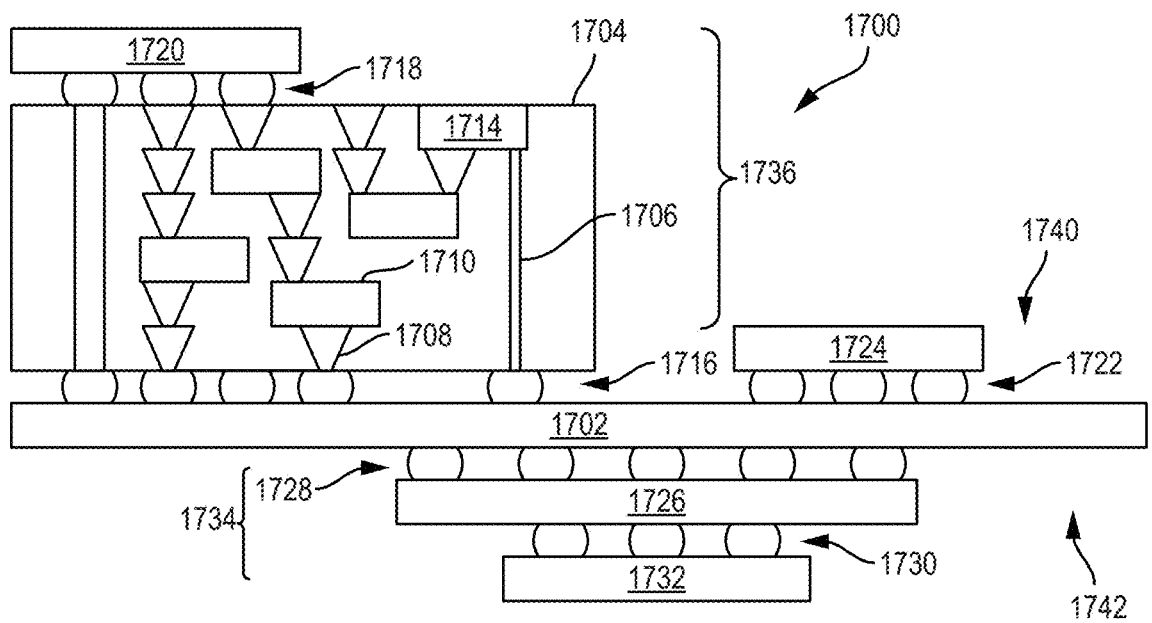
FIG. 15 is a side, cross-sectional view of an IC device assembly that may include a thermally managed MCP, in accordance with any of the embodiments disclosed herein.

FIG. 15 is a side, cross-sectional view of an IC device assembly 1700 that may include one or more IC packages or other electronic components in accordance with any of the embodiments disclosed herein. For example, the IC device assembly 1700 may include one or thermally managed MCPs 100 in accordance with any of the embodiments disclosed herein. The IC device assembly 1700 includes a number of elements disposed on a circuit board 1702 (which may be, e.g., a motherboard). The IC device assembly 1700 includes elements disposed on a first face 1740 of the circuit board 1702 and an opposing second face 1742 of the circuit board 1702; generally, elements may be disposed on one or both faces 1740 and 1742. Any of the IC packages discussed below with reference to the IC device assembly 1700 may take the form of any of the embodiments of the thermally managed MCPs 100 disclosed herein.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the elements coupled to the circuit board 1702. In other embodiments, the circuit board 1702 may be a non-PCB substrate.

The IC device assembly 1700 illustrated in FIG. 15 includes a package-on-interposer structure 1736 coupled to the first face 1740 of the circuit board 1702 by coupling elements 1716. The coupling elements 1716 may electrically and mechanically couple the package-on-interposer structure 1736 to the circuit board 1702, and may include solder balls (as shown in FIG. 15), male and female portions of a socket, an adhesive, an underfill material, and/or any other suitable electrical and/or mechanical coupling structure.

The package-on-interposer structure 1736 may include an IC package 1720 coupled to a package interposer 1704 by coupling elements 1718. The coupling elements 1718 may take any suitable form for the application, such as the forms discussed above with reference to the coupling elements 1716. Although a single IC package 1720 is shown in FIG. 15, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 13), an IC device (e.g., the IC device 1600 of FIG. 14), or any other suitable elements. Generally, the package interposer 1704 may spread a connection to a wider pitch or reroute a connection to a different connection. For example, the package interposer 1704 may couple the IC package 1720 to a set of BGA conductive contacts of the coupling elements 1716 for coupling to the circuit board 1702. In the embodiment illustrated in FIG. 15, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more elements may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal interconnects 1708 and vias 1710, including but not limited to through silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling elements 1722. The coupling elements 1722 may take the form of any of the embodiments discussed above with reference to the coupling elements 1716, and the IC package 1724 may take the form of any of the embodiments discussed above with reference to the IC package 1720.

The IC device assembly 1700 illustrated in FIG. 15 includes a package-on-package structure 1734 coupled to the second face 1742 of the circuit board 1702 by coupling elements 1728. The package-on-package structure 1734 may include an IC package 1726 and an IC package 1732 coupled together by coupling elements 1730 such that the IC package 1726 is disposed between the circuit board 1702 and the IC package 1732. The coupling elements 1728 and 1730 may take the form of any of the embodiments of the coupling elements 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 16:
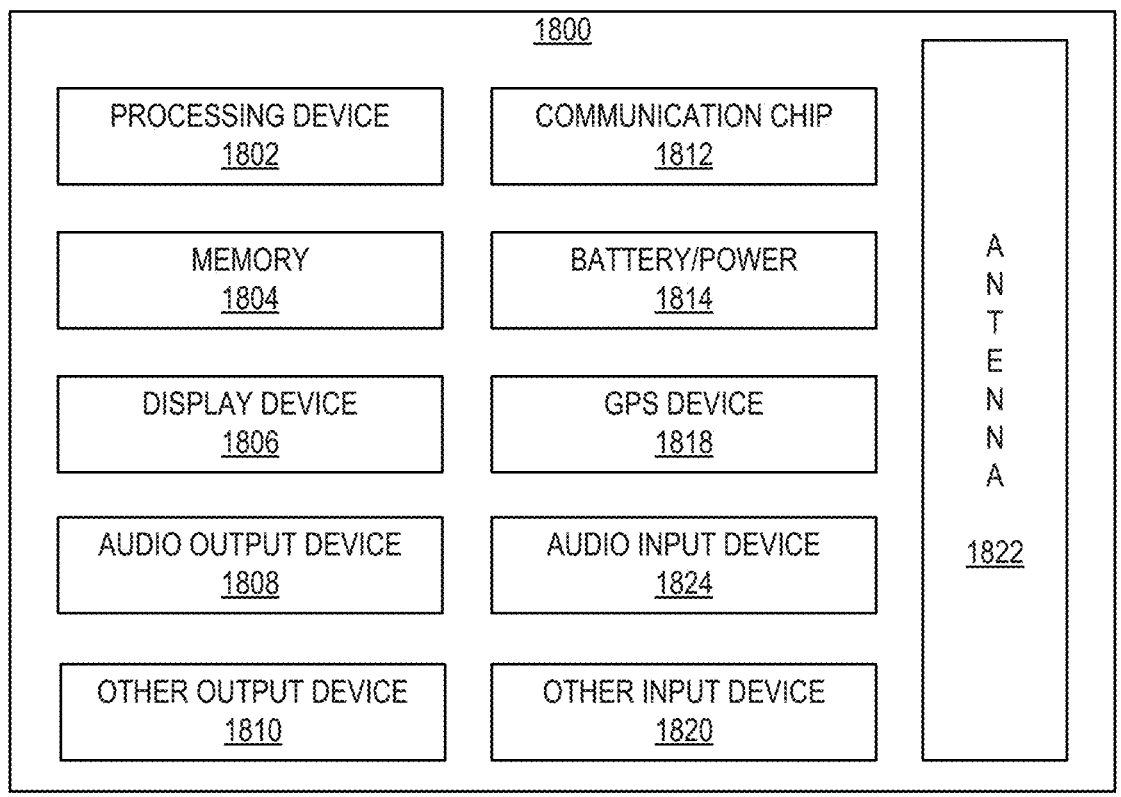
FIG. 16 is a block diagram of an example electrical device that may include a thermally managed MCP, in accordance with any of the embodiments disclosed herein.

FIG. 16 is a block diagram of an example electrical device 1800 that may include one or more thermally manage MCPs 100 in accordance with any of the embodiments disclosed herein. For example, any suitable ones of the elements of the electrical device 1800 may include one or more of the IC device assemblies 1700, IC packages 1650, IC devices 1600, or die 1502 disclosed herein. A number of elements are illustrated in FIG. 16 as included in the electrical device 1800, but any one or more of these elements may be omitted or duplicated, as suitable for the application. In some embodiments, some or all of the elements included in the electrical device 1800 may be attached to one or more motherboards. In some embodiments, some or all of these elements are fabricated onto a single system-on-a-chip (SoC) die.

Additionally, in various embodiments, the electrical device 1800 may not include one or more of the elements illustrated in FIG. 16, but the electrical device 1800 may include interface circuitry for coupling to the one or more elements. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), CPUs, GPUs, cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling elements of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing element, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an apparatus, including: a thermal assembly for a multi-chip package (MCP), including a heat pipe having a ring shape.

Example 2 includes the subject matter of Example 1, and further includes: a thermally conductive region in an opening of the heat pipe.

Example 3 includes the subject matter of Example 2, and further specifies that the thermally conductive region includes copper or aluminum.

Example 4 includes the subject matter of any of Examples 2-3, and further includes: a thermally insulative region between the heat pipe and the thermally conductive region.

Example 5 includes the subject matter of Example 4, and further specifies that the thermally insulative region includes air.

Example 6 includes the subject matter of any of Examples 4-5, and further specifies that the thermally insulative region includes epoxy.

Example 7 includes the subject matter of any of Examples 2-6, and further specifies that the thermally conductive region is part of a heat sink, and the thermal assembly further includes: a thermal interface material (TIM) between the heat pipe and the heat sink.

Example 8 includes the subject matter of any of Examples 1-7, and further specifies that the thermal assembly further includes a plurality of fins.

Example 9 includes the subject matter of Example 8, and further includes: a thermally insulative region between the heat pipe and the fins.

Example 10 includes the subject matter of Example 9, and further specifies that the thermally insulative region includes air or epoxy.

Example 11 includes the subject matter of any of Examples 1-10, and further specifies that the heat pipe is included in a lid.

Example 12 includes the subject matter of any of Examples 1-11, and further includes: a package substrate; and a plurality of integrated circuit (IC) components coupled to the package substrate.

Example 13 includes the subject matter of Example 12, and further specifies that the plurality of IC components include at least one inner IC component and a plurality of outer IC components, and the heat pipe extends at least partially over the outer IC components.

Example 14 includes the subject matter of Example 13, and further specifies that an opening of the heat pipe extends at least partially over the at least one inner IC component.

Example 15 includes the subject matter of any of Examples 13-14, and further includes: portions of thermal interface material (TIM) between the IC components and the thermal assembly.

Example 16 includes the subject matter of any of Examples 13-15, and further specifies that at least one of the outer IC components include high bandwidth memory (HBM).

Example 17 includes the subject matter of Example 16, and further specifies that at least one inner IC component includes a central processing unit (CPU) or a graphics processing unit (GPU).

Example 18 includes the subject matter of any of Examples 12-17, and further includes: a heat channel, wherein a portion of the heat channel is embedded in the package substrate and another portion extends from the package substrate to make thermal contact with the thermal assembly.

Example 19 includes the subject matter of any of Examples 12-18, and further specifies that at least some of the plurality of IC components are coupled to the package substrate via intervening interposers.

Example 20 includes the subject matter of Example 19, and further specifies that the interposers are silicon interposers.

Example 21 includes the subject matter of any of Examples 19-20, and further specifies that the plurality of IC components include at least one inner IC component and a plurality of outer IC components, and at least some of the outer IC components are coupled to the package substrate via intervening interposers.

Example 22 is an apparatus, including: a thermal assembly for a multi-chip package (MCP), including a plurality of heat pipes arranged in a ring shape such that individual heat pipes extend from an opening in the ring shape to an exterior of the ring shape.

Example 23 includes the subject matter of Example 22, and further includes: a thermally conductive region in an opening of the ring shape.

Example 24 includes the subject matter of Example 23, and further specifies that the thermally conductive region includes copper or aluminum.

Example 25 includes the subject matter of any of Examples 23-24, and further includes: a thermally insulative region between individual ones of the heat pipes and the thermally conductive region.

Example 26 includes the subject matter of Example 25, and further specifies that the thermally insulative region includes air.

Example 27 includes the subject matter of any of Examples 25-26, and further specifies that the thermally insulative region includes epoxy.

Example 28 includes the subject matter of any of Examples 23-27, and further specifies that the thermally conductive region is part of a heat sink, and the thermal assembly further includes: a thermal interface material (TIM) between individual ones of the heat pipes and the heat sink.

Example 29 includes the subject matter of any of Examples 22-28, and further specifies that the thermal assembly further includes a plurality of fins.

Example 30 includes the subject matter of Example 29, and further includes: a thermally insulative region between individual ones of the heat pipes and the fins.

Example 31 includes the subject matter of Example 30, and further specifies that the thermally insulative region includes air or epoxy.

Example 32 includes the subject matter of any of Examples 22-31, and further specifies that the heat pipes are included in a lid.

Example 33 includes the subject matter of any of Examples 22-30, and further includes: a package substrate; and a plurality of integrated circuit (IC) components coupled to the package substrate.

Example 34 includes the subject matter of Example 33, and further specifies that the plurality of IC components include at least one inner IC component and a plurality of outer IC components, and individual ones of the heat pipes extend at least partially over individual ones of the outer IC components.

Example 35 includes the subject matter of Example 34, and further specifies that the opening of the ring shape extends at least partially over the at least one inner IC component.

Example 36 includes the subject matter of any of Examples 34-35, and further includes: portions of thermal interface material (TIM) between the IC components and the thermal assembly.

Example 37 includes the subject matter of any of Examples 34-36, and further specifies that at least one of the outer IC components include high bandwidth memory (HBM).

Example 38 includes the subject matter of Example 37, and further specifies that at least one inner IC component includes a central processing unit (CPU) or a graphics processing unit (GPU).

Example 39 includes the subject matter of any of Examples 33-38, and further includes: a heat channel, wherein a portion of the heat channel is embedded in the package substrate and another portion extends from the package substrate to make thermal contact with the thermal assembly.

Example 40 includes the subject matter of any of Examples 33-39, and further specifies that at least some of the plurality of IC components are coupled to the package substrate via intervening interposers.

Example 41 includes the subject matter of Example 40, and further specifies that the interposers are silicon interposers.

Example 42 includes the subject matter of any of Examples 40-41, and further specifies that the plurality of IC components include at least one inner IC component and a plurality of outer IC components, and at least some of the outer IC components are coupled to the package substrate via intervening interposers.

Example 43 includes the subject matter of any of Examples 22-42, and further specifies that individual ones of the heat pipes include an envelope, a wick, and a working fluid.

Example 44 is an apparatus, including: a package substrate having a first surface and an opposing second surface; a plurality of integrated circuit (IC) components coupled to the package substrate such that the second surface is between the first surface and the plurality of IC components, wherein the plurality of IC components include at least one inner IC component and a plurality of outer IC components; and a heat channel, wherein a first portion of the heat channel is embedded in the package substrate at least partially under one of the outer IC components and a second portion extends from the second surface of the package substrate.

Example 45 includes the subject matter of Example 44, and further specifies that the heat channel is not in electrical contact with the IC components.

Example 46 includes the subject matter of any of Examples 44-45, and further specifies that the first portion of the heat channel includes copper.

Example 47 includes the subject matter of any of Examples 44-46, and further specifies that the heat channel is one of a plurality of heat channels having first portions at least partially under an associated one of the outer IC components.

Example 48 includes the subject matter of any of Examples 44-47, and further includes: a thermal assembly extending over the plurality of IC components, wherein the second portion of the heat channel is in thermal contact with the thermal assembly.

Example 49 includes the subject matter of Example 48, and further specifies that the thermal assembly includes a lid.

Example 50 includes the subject matter of any of Examples 48-49, and further specifies that the thermal assembly includes fins.

Example 51 includes the subject matter of any of Examples 48-50, and further specifies that the thermal assembly includes a heat pipe.

Example 52 includes the subject matter of Example 51, and further specifies that the heat pipe has a ring shape.

Example 53 includes the subject matter of any of Examples 44-52, and further specifies that at least some of the plurality of IC components are coupled to the package substrate via intervening interposers.

Example 54 includes the subject matter of Example 53, and further specifies that the interposers are silicon interposers.

Example 55 includes the subject matter of any of Examples 53-54, and further specifies that the plurality of IC components include at least one inner IC component and a plurality of outer IC components, and at least some of the outer IC components are coupled to the package substrate via intervening interposers.

Example 56 includes the subject matter of any of Examples 44-55, and further specifies that the outer IC components include at least one high bandwidth memory (HBM) component, or the first portion of the heat channel includes a heat pipe.

Example 57 is an apparatus, including: a package substrate; and a plurality of integrated circuit (IC) components coupled to the package substrate, wherein the plurality of IC components include at least one inner IC component and a plurality of outer IC components, and wherein at least some of the plurality of outer IC components are coupled to the package substrate via intervening interposers.

Example 58 includes the subject matter of Example 57, and further specifies that at least one of the outer IC components include high bandwidth memory (HBM).

Example 59 includes the subject matter of Example 58, and further specifies that at least one inner IC component includes a central processing unit (CPU) or a graphics processing unit (GPU).

Example 60 includes the subject matter of any of Examples 57-59, and further specifies that an individual interposer has a thickness that is less than 100 microns.

Example 61 includes the subject matter of any of Examples 57-59, and further specifies that an individual interposer has a thickness that is between 100 microns and 1000 microns.

Example 62 includes the subject matter of any of Examples 57-61, and further specifies that individual ones of the interposers are disposed between a single IC component and the package substrate.

Example 63 includes the subject matter of any of Examples 57-62, and further specifies that at least some of the plurality of outer IC components include high bandwidth memory (HBM), and individual ones of these HBM components are coupled to the package substrate by associated individual interposers.

Example 64 includes the subject matter of any of Examples 57-63, and further specifies that the interposers are silicon interposers.

Example 65 is an apparatus, including: a package substrate; a plurality of integrated circuit (IC) components coupled to the package substrate, wherein the plurality of IC components include at least one central processing unit (CPU) or a graphics processing unit (GPU), and the plurality of IC components includes a plurality of high bandwidth memory (HBM) components; and a plurality of interposers, wherein individual ones of the interposers are disposed between individual ones of the HBM components and the package substrate.

Example 66 includes the subject matter of Example 65, and further specifies that an individual interposer has a thickness that is less than 100 microns.

Example 67 includes the subject matter of Example 65, and further specifies that an individual interposer has a thickness that is between 100 microns and 1000 microns.

Example 68 includes the subject matter of any of Examples 65-67, and further specifies that the interposers are silicon interposers.

Example 69 includes the subject matter of any of Examples 65-68, and further includes: a thermal assembly extending over the plurality of IC components.

Example 70 includes the subject matter of Example 69, and further specifies that the thermal assembly includes a lid.

Example 71 includes the subject matter of any of Examples 69-70, and further specifies that the thermal assembly includes fins.

Example 72 includes the subject matter of any of Examples 69-71, and further specifies that the thermal assembly includes a heat pipe.

Example 73 includes the subject matter of Example 72, and further specifies that the heat pipe has a ring shape.

Example 74 is a computing device, including: a circuit board; and the apparatus of any of Examples 1-73 coupled to the circuit board.

Example 75 includes the subject matter of Example 74, and further specifies that the circuit board is a motherboard.

Example 76 includes the subject matter of any of Examples 74-75, and further includes: a display device.

Example 77 includes the subject matter of any of Examples 74-76, and further includes: wireless communication circuitry.

Example 78 includes the subject matter of any of Examples 74-77, and further includes: one or more input devices.

The invention claimed is:

1. An apparatus, comprising:
   a package substrate for a multi-chip package (MCP);
   an IC component coupled to a surface of the package substrate; and
   a thermal assembly, including:
      a lid having legs perpendicular to the surface of the package substrate, the legs coupled to the surface of the package substrate with a sealant such that the IC component is between the lid and the package substrate, and the lid further comprises:
         a heat pipe having a ring shape, the heat pipe including:
            an interior portion configured for flow of a working fluid;
            a thermally conductive outer envelope surrounding the interior portion;
            a wicking material between the interior portion and the outer envelope;
         a thermally conductive region in an opening of the heat pipe; and
         a thermally insulative region between the heat pipe and the thermally conductive region, wherein the thermally insulative region includes epoxy.

2. The apparatus of claim 1, wherein the thermally conductive region includes copper or aluminum.

3. The apparatus of claim 1, further comprising:
   a plurality of IC components coupled to the package substrate.

4. The apparatus of claim 3, wherein the plurality of IC components include at least one inner IC component and a plurality of outer IC components, and the heat pipe extends at least partially over the outer IC components.

5. The apparatus of claim 4, wherein an opening of the heat pipe extends at least partially over the at least one inner IC component.

6. The apparatus of claim 5, further comprising:
   a thermally conductive region in an opening of the heat pipe,
   wherein the thermally conductive region is aligned with at least one outer edge of the at least one inner IC component.

7. The apparatus of claim 5, wherein at least one of the outer IC components include high bandwidth memory (HBM).

8. The apparatus of claim 5, wherein the at least one inner IC component includes a central processing unit (CPU) or a graphics processing unit (GPU).

9. The apparatus of claim 6, wherein the thermally conductive region includes copper or aluminum.

10. The apparatus of claim 9, further comprising:
    a thermally insulative region between the heat pipe and the thermally conductive region.

11. The apparatus of claim 10, wherein the thermally insulative region includes epoxy.

12. The apparatus of claim 4, further comprising:
    a thermally conductive region in an opening of the heat pipe,
    wherein the thermally conductive region is aligned with at least one outer edge of the at least one inner IC component.

13. The apparatus of claim 12, wherein the thermally conductive region includes copper or aluminum.

14. The apparatus of claim 12, further comprising:
    a thermally insulative region between the heat pipe and the thermally conductive region.

15. The apparatus of claim 14, wherein the thermally insulative region includes epoxy.

16. The apparatus of claim 4, wherein at least one of the outer IC components include high bandwidth memory (HBM).

17. The apparatus of claim 4, wherein the at least one inner IC component includes a central processing unit (CPU) or a graphics processing unit (GPU).

18. An apparatus, comprising:
    a package substrate;
    an IC component coupled to a surface of the package substrate; and
    a lid coupled to the IC component and the package substrate, wherein the lid comprises:
       a top portion parallel to the surface of the package substrate, the top portion coupled to the IC component;
       a bottom portion perpendicular to the surface of the package substrate, the bottom portion coupled to the package substrate with a sealant; and
       a ring-shaped heat pipe in the top portion, wherein the heat pipe includes:
          a channel configured for flow of a working fluid;
          a thermally conductive outer envelope surrounding the channel; and
          a wicking material between the channel and the outer envelope;
       a thermally conductive region in an opening of the heat pipe; and
       a thermal insulator between the heat pipe and the thermally conductive region, wherein the thermal insulator includes epoxy.

19. The apparatus of claim 18, wherein the top portion comprises peripheral zone and a medial zone, the peripheral zone comprising the heat pipe, and the medial zone comprising the thermally conductive region.

20. The apparatus of claim 19, wherein the peripheral zone and the medial zone are separated by the thermal insulator.

21. The apparatus of claim 18, further comprising a heat sink having a base and fins, the base being coupled to the top portion of the lid opposite to the IC component.

22. The apparatus of claim 18, further comprising a plurality of IC components coupled to the lid, between the top portion of the lid and the package substrate.

* * * * *